United States Patent
Li et al.

(10) Patent No.: US 11,770,920 B2
(45) Date of Patent: Sep. 26, 2023

(54) EMI SHIELDING MATERIAL, EMI SHIELDING PROCESS, AND COMMUNICATION MODULE PRODUCT

(71) Applicant: HUZHOU JIANWENLU TECHNOLOGY CO., LTD., Huzhou (CN)

(72) Inventors: Linping Li, Huzhou (CN); Jinghao Sheng, Hangzhou (CN); Zhou Jiang, Huzhou (CN)

(73) Assignee: HUZHOU JIANWENLU TECHNOLOGY CO., LTD., Huzhou (CN)

( * ) Notice: Subject to any disclaimer, the term of this patent is extended or adjusted under 35 U.S.C. 154(b) by 0 days.

(21) Appl. No.: 17/771,014

(22) PCT Filed: Sep. 11, 2020

(86) PCT No.: PCT/CN2020/114836
§ 371 (c)(1),
(2) Date: Apr. 22, 2022

(87) PCT Pub. No.: WO2021/077937
PCT Pub. Date: Apr. 29, 2021

(65) Prior Publication Data
US 2022/0418174 A1 Dec. 29, 2022

(30) Foreign Application Priority Data
Oct. 23, 2019 (CN) .......................... 201911014276.4

(51) Int. Cl.
*H05K 9/00* (2006.01)
(52) U.S. Cl.
CPC ........... *H05K 9/0088* (2013.01); *H05K 9/006* (2013.01)

(58) Field of Classification Search
CPC .... H05K 1/14; H05K 1/141–144; H05K 1/18; H05K 1/181–187; H05K 9/00;
(Continued)

(56) References Cited

U.S. PATENT DOCUMENTS

| 5,372,886 A * | 12/1994 | Inazawa | ................ H01B 7/292 |
| | | | 428/389 |
| 8,004,853 B2 * | 8/2011 | Kita | ....................... H05K 7/026 |
| | | | 361/777 |

(Continued)

FOREIGN PATENT DOCUMENTS

| CN | 101191007 A | 6/2008 |
| CN | 103496228 A | 1/2014 |

(Continued)

OTHER PUBLICATIONS

Japanese Patent Office, 1st Office Action Issued in Application No. 2022-523920, dated Sep. 27, 2022, 27 pages.

(Continued)

*Primary Examiner* — Tuan T Dinh
(74) *Attorney, Agent, or Firm* — KILPATRICK TOWNSEND & STOCKTON, LLP (57) ABSTRACT

Disclosed is an EMI shielding material. The EMI shielding material includes a resin material and metal particles mixed with each other, and the surface of the metal particles has an insulating protective layer. Further disclosed is a communication module product, including a module element arranged on a substrate, and the periphery of the module element that requires EMI shielding is filled with said shielding material. Further disclosed is an EMI shielding process, including the following steps: a. preparing a communication module on which a module element is provided; and b. applying said shielding material to a region of the module element that needs to be EMI shielded on the communication module. The shielding material shields a (Continued)

chip region in a wrapping manner, that is, the shielding material wraps and shields all six surfaces or six directions of the chip, and provides shielding between chips.

17 Claims, 5 Drawing Sheets (58) Field of Classification Search
CPC ...... H05K 9/006; H05K 9/0088; H01L 23/66; H01L 23/3121; H01L 23/552; H01L 23/055; H01L 23/60; H01L 25/0652; H01L 25/162
USPC ....... 361/760–764, 784, 795, 803, 816, 818; 174/520; 257/659
See application file for complete search history.

(56) References Cited

U.S. PATENT DOCUMENTS

| | | | |
|---|---|---|---|
| 9,685,413 B1* | 6/2017 | Prakash | H01L 23/49838 |
| 10,076,028 B2* | 9/2018 | Kasuga | H05K 1/0298 |
| 2002/0039667 A1* | 4/2002 | Takaya | H01Q 1/38 |
| | | | 428/323 |
| 2006/0163744 A1* | 7/2006 | Vanheusden | H01L 23/49883 |
| | | | 257/E21.174 |
| 2008/0213565 A1 | 9/2008 | Simpson et al. | |
| 2009/0296361 A1* | 12/2009 | Huang | H05K 3/284 |
| | | | 361/783 |
| 2011/0174519 A1* | 7/2011 | Shah | H01B 3/004 |
| | | | 264/108 |
| 2012/0187585 A1* | 7/2012 | Yamazaki | H01L 23/295 |
| | | | 257/E23.118 |
| 2013/0082368 A1* | 4/2013 | Kim | H01L 23/3135 |
| | | | 257/659 |
| 2015/0043189 A1* | 2/2015 | Kitazaki | H05K 3/244 |
| | | | 29/832 |
| 2015/0061095 A1* | 3/2015 | Choi | H01L 23/5385 |
| | | | 257/777 |
| 2015/0076670 A1* | 3/2015 | Pan | H01L 23/552 |
| | | | 257/659 |
| 2015/0124417 A1* | 5/2015 | Nakao | H05K 9/0045 |
| | | | 361/761 |
| 2017/0287604 A1 | 10/2017 | Kawabata | |
| 2017/0287848 A1* | 10/2017 | Kawabata | H01L 23/3114 |
| 2017/0358540 A1* | 12/2017 | Min | H01L 23/552 |
| 2018/0108617 A1 | 4/2018 | Kawabata | |
| 2018/0158782 A1 | 6/2018 | Kawabata | |
| 2019/0206804 A1* | 7/2019 | Jung | H01L 23/3128 |
| 2020/0006203 A1* | 1/2020 | Marin | H01L 23/4924 |

FOREIGN PATENT DOCUMENTS

| | | |
|---|---|---|
| CN | 103571215 A | 2/2014 |
| CN | 105474334 A | 4/2016 |
| CN | 106961826 A | 7/2017 |
| CN | 107424961 A | 12/2017 |
| CN | 107452696 A | 12/2017 |
| CN | 107507823 A | 12/2017 |
| CN | 207489847 U | 6/2018 |
| CN | 110752189 A | 2/2020 |
| JP | 2010518228 A | 5/2010 |
| JP | 2016184641 A | 10/2016 |
| JP | 2017188647 A | 10/2017 |
| JP | 2018093155 A | 6/2018 |
| KR | 20180021336 A | 3/2018 |

OTHER PUBLICATIONS

European Patent Office, Extended European Search Report Issued in Application No. 20879295.2, dated Oct. 24, 2022, Germany, 10 pages.

* cited by examiner

Figure 1

--Prior Art--

Figure 2

--Prior Art--

EMI SHIELDING MATERIAL, EMI SHIELDING PROCESS, AND COMMUNICATION MODULE PRODUCT

CROSS-REFERENCE TO RELATED APPLICATIONS

The present application is a National Stage application of PCT international application PCT/CN2020/114836, filed on Sep. 11, 2020 which claims priority to Chinese Patent Application No. 201911014276.4, filed on Oct. 23, 2019 with the China National Intellectual Property Administration, both of which are incorporated herein by reference in their entireties.

FIELD

Embodiments of the present disclosure relate to the electromagnetic field, and in particular, to an EMI shielding material, a communication module product, and an EMI shielding process.

BACKGROUND

A conventional EMI shielding technology is mainly applied to cellular terminals such as mobile phones. Due to complexity of frequency bands, simultaneous use of adjacent frequency bands demanded for carrier aggregation, a smaller internal space of a terminal and more highly integrated, interference between modules becomes a problem. In order to ensure a communication effect of the terminal and reduce an overall power consumption of the terminal, EMI shielding between modules, especially for low-frequency bands is required more highly. With the development of communication technology, a high-standard EMI shielding technology is widely adopted by various terminals, such as intelligent terminals, drones, driverless vehicles, vehicle communication modules, IOT, to ensure performance of communication modules.

A conventional EMI shielding technology mainly includes: a conformal EMI shielding structure and a segmented EMI shielding structure. The conformal EMI shielding structure is realized by applying a metal shielding layer through sputtering or spraying, which cannot realize a segmented shielding. The segmented EMI shielding structure is realized generally by providing an independent shielding area for each chip device, specifically, by forming a segmented shielding structure between devices through grooving and filling or gluing. However, the segmented process has a high manufacturing cost, and is hard to manage and control. In addition, none of conventional shielding structures realizes EMI shielding on the bottom of a chip, and conventional shielding structures has a high cost, which is not conducive to mass production.

SUMMARY

In view of the problems in the convention technology, an improved EMI shielding material, an EMI shielding process, and a communication module product to which the EMI shielding material process are applied are provided according the present disclosure.

In one of the present disclosure, an EMI shielding material is provided. The EMI shielding material includes a resin material and metal particles, where the resin material and the metal particles are mixed with each other, and an insulating protective layer is disposed on a surface of each of the metal particles. The EMI shielding material has good shielding property and insulating property, and may be directly applied to a radio frequency module. In addition, the EMI shielding material has a low manufacturing cost and construction cost, which is very conducive to mass production.

In one embodiment, the shielding material further includes silica particles mixed in a specific proportion. Addition of the silica particles may reduce an expansion coefficient of the shielding material.

In one embodiment, the shielding material further includes alumina particles mixed in a specific proportion. Addition of the alumina particles may reduce a heat dissipation coefficient of the shielding material.

In one embodiment, the metal particles account for 1% to 95% of a weight of the shielding material, and a diameter of the metal particles is between 0.1 μm and 30 μm. The proportion may be determined based on a required EMI shielding effect. A higher proportion results in a better shielding effect. Since each of the metal particles has an insulating protective layer, insulation of the shielding material is not affected due to a high proportion of the metal particles contained in the shielding material.

In one embodiment, the silica particles account for 1% to 40% of a weight of the shielding material, and a size of the silica particles is between 0.1 μm and 30 μm. The proportion and size are determined based on an actual need.

In one embodiment, the alumina particles account for 1% to 40% of a weight of the shielding material, and a size of the alumina particles is between 0.1 μm and 30 μm. The proportion and size are determined based on an actual need.

In one embodiment, the shielding material further includes a curing agent, and the curing agent account for 0.1% to 0.2% of a weight of the shielding material. The curing agent may facilitate curing of the shielding material.

In one embodiment, the resin material account for 1% to 30% of a weight of the shielding material. In one embodiment, a material of the metal particles is selected from a group consisting of silver, gold, copper, chromium, nickel, nickel-iron, an alloy thereof, and a gradient composite thereof. Material of the metal particles may be selected differently to meet different shielding requirements (such as for low frequency interference or high frequency interference).

In one embodiment, the metal particles include a mixture of particles made of different metal materials. Metal particles of different materials may be selected together to meet a requirement of full-frequency shielding.

In one embodiment, the insulating protective layer on each of the metal particles is a coating of resin, Teflon, silicon nitride or silicon oxide, and a thickness of the insulating protective layer is between 1 nm and 5000 nm. The insulating protective layer ensures insulating property of the metal particles, to realize an integral insulating property of the shielding material.

In another embodiment of the present disclosure, a communication module product is provided. The communication module product includes a module element provided on a substrate, and a periphery of the module element is filled with the shielding material as described above to perform EMI shielding on the module element. A shielding effect may be achieved by simply filling the periphery of the module element with the shielding material disclosed in the present disclosure, without applying additional insulating protective material to the module element. The module element may be a device such as a resistor, a capacitor or a combiner.

In one embodiment, a region between the module element and the substrate is filled with the EMI shielding material, and a top of the module element is filled with the EMI shielding material. By filling the top and bottom of the module element with the shielding materials, shielding is performed on the module element in six directions, and thus shielding between two module elements may be realized, which achieves effects of both the segmented shielding and the conformal shielding in the conventional technology.

In one embodiment, the shielding material at the top of the module element has a thickness greater than 30 um. It is found that such thickness results in a desired shielding effect.

In one embodiment, the communication module product is coated by a metal shielding layer. A double-layer shielding effect is achieved by further providing the metal shielding layer, which results in better shielding for the communication module product.

In another embodiment of the present disclosure, an EMI shielding process is provided. The EMI shielding process includes: step a, preparing a communication module on which a module element is provided; and step b, applying the EMI shielding material as described above on a region of the module element on the communication module where EMI shielding is to be performed. The EMI shielding process can be implemented simply and has a low cost, which is conducive to mass production, and achieves a better shielding effect compared to the conventional method.

In one embodiment, the EMI shielding material may be applied through at least one of a printing process or a dispensing process.

In one embodiment, the printing process includes: arranging a customized screen on a region of the communication module to be covered; and printing the EMI shielding material.

In one embodiment, the printing process may be vacuum printing. It is proved through experiments that the vacuum printing can achieve better effect in applying the EMI shielding material.

In one embodiment, the dispensing process includes filling or covering, with the EMI shielding material, a bottom and a top of the module element through dispensing.

In one embodiment, the process further includes: step c, perform injection molding on the communication module after the shielding material is applied. A uniform surface may be formed outside the communication module by injection molding, which facilitates performing of subsequent processes.

In one embodiment, the process further includes: step d, performing sputtering or spraying on an outer layer of the communication module after the injection molding, to form a metal shielding layer. A double-layer shielding is realized after this step.

BRIEF DESCRIPTION OF THE DRAWINGS

The accompanying drawings are included to provide a further understanding of the embodiments and are incorporated into and constitute a part of this specification. The drawings illustrate embodiments and together with the description serve to explain the principles of the present disclosure. Other embodiments and many of the intended advantages of the embodiments will be readily recognized as they become better understandable by reference to the following detailed description. The elements of the drawings are not necessarily drawn to scale with each other. Similar components are denoted with similar reference numerals.

DETAILED DESCRIPTION

The present disclosure is described in further detail below with reference to the accompanying drawings and embodiments. It should be understood that the specific embodiments described herein are intended only to explain, rather than to limit, the present disclosure. In addition, it should be noted that only components related to the present disclosure are shown in the drawings for ease of description.

It should be noted that the embodiments in the present disclosure and features of the embodiments may be combined with each other in the case of no conflict. The present disclosure is described in detail below with reference to the accompanying drawings and in conjunction with the embodiments.

Figure 1:
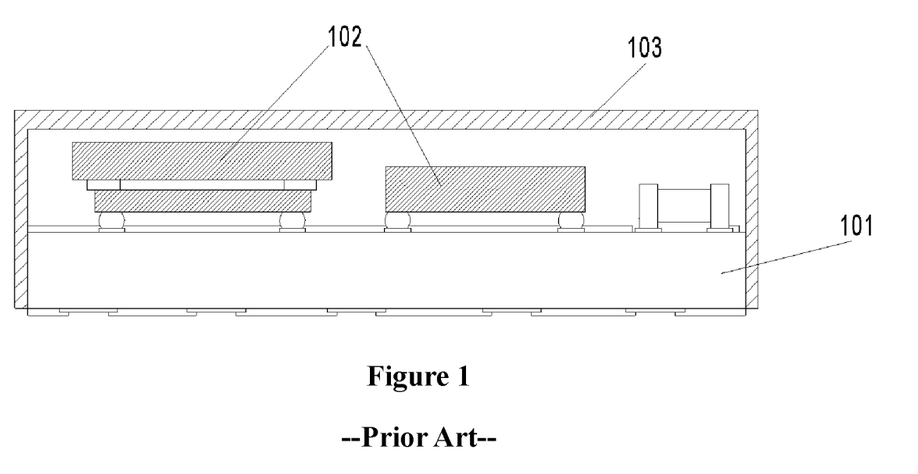
FIG. 1 is a schematic diagram of a conformal EMI shielding structure according to a conventional technology.

FIG. 1 shows a schematic diagram of a conformal EMI shielding structure according to a conventional technology. As shown in FIG. 1, a radio frequency communication module product 101 is provided with chips 102 such as a filter, a low noise amplifier (LNA), a low pass filter (LPF), a combiner, a switch, and an operational amplifier (PA). A metal shielding layer 103 is provided on the radio frequency communication module product 101 on which the EMI shielding is to be performed. The metal shielding layer 103 is typically applied by sputtering a copper target or spraying a silver paste onto the product. The metal shielding layer 103 can be applied by a simple process, but has a poor shielding effect against high frequency interference or is difficult to achieve segmented shielding.

Figure 2:
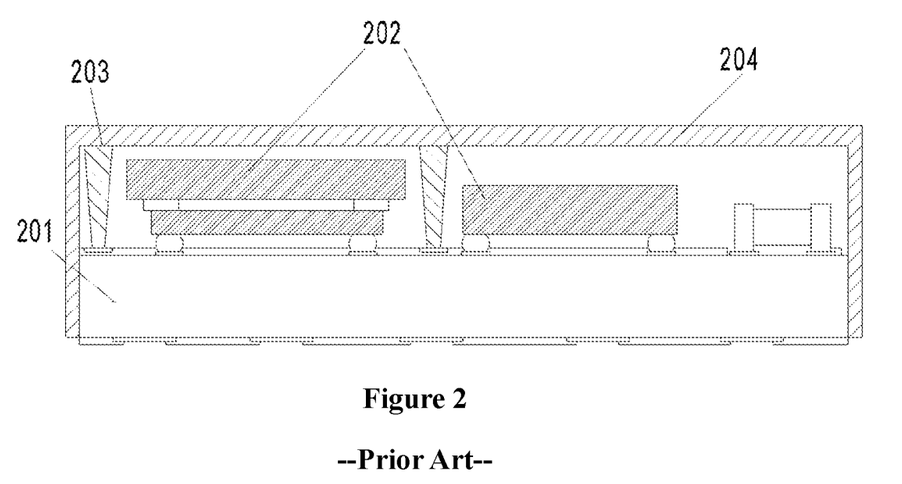
FIG. 2 is a schematic diagram of a segmented EMI shielding structure according to a conventional technology.

FIG. 2 shows a schematic diagram of a segmented EMI shielding structure according a conventional technology. As shown in FIG. 2, a radio frequency communication module product 201 is provided with chips 202. A segmented shielding structure 203 is arranged between the chips 202, to provide an independent shielding region with each of the chips, to improve shielding effect. The segmented shielding structure is generally realized by: slotting around the chips on which segmented shielding is required; sputtering, spraying or filling with a conductive material (or forming shielding between the chips through wire bonding); and finally providing a metal shielding layer 204 on an outer surface of the module. In this way, isolated shielding effect is achieved for regions as required. However, the segmental shielding requires a complex process and has a high cost, and especially has a poor shielding effect against low-frequency interference. The low frequency mainly indicates a communication frequency band of 500 MHz to 800 MHz.

Figure 3:
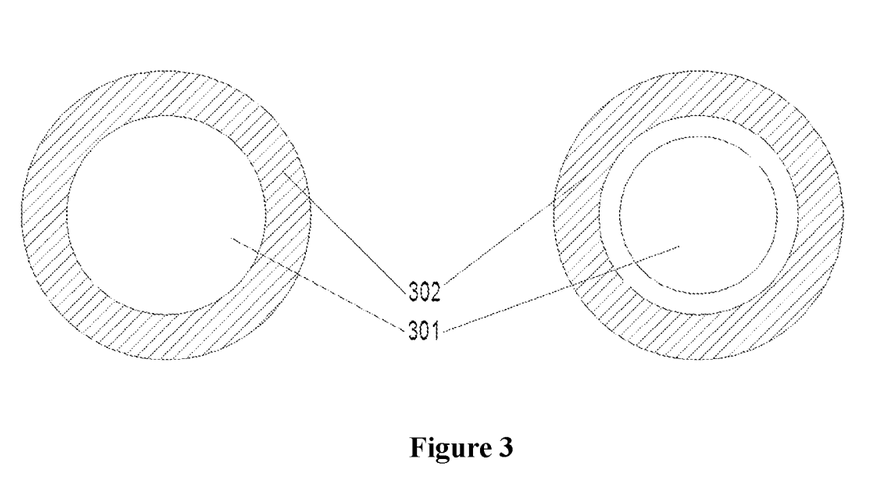
FIG. 3 is a schematic structural diagram of metal particles in a shielding material according to an embodiment of the present disclosure.
Figure 7:
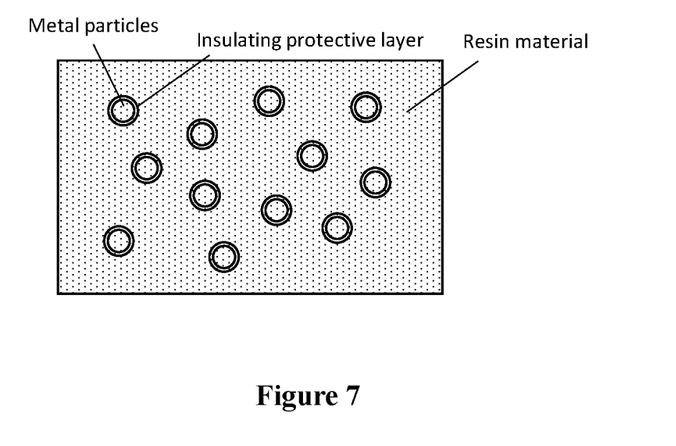
FIG. 7 is a schematic diagram of an EMI shielding material according to an embodiment of the disclosure.

One embodiment of the shielding technology disclosed in the present disclosure lies in the use of special shielding materials. As shown in FIG. 7, the shielding material includes a resin material and metal particles, where the resin material and the metal particles are mixed with each other, and an insulating protective layer is disposed on a surface of each of the metal particles. Each of the metal particles may be a metal ball 301 as shown in FIG. 3. The metal particles are not limited to be spherical or circular, but may be of another shape such as flat or oval, or may be a mixture of particles of different sizes or shapes.

A nano-scale resin coating is disposed on the surface of the metal ball, which forms the insulating protective layer 302. In addition, the metal ball may be a pure-metal ball (as shown in a left of FIG. 3) or a composite metal ball (as shown in a right of FIG. 3). The metal particles may be of any shapes other than spheres. In addition, a material of the metal particles may be determined based on different shielding effects. For example, the material of the metal particles may be selected from a group consisting of gold, silver, copper, chromium, nickel, nickel-iron, an alloy thereof, and a gradient composite thereof. For example, the metal particle may be composed of multi-layer metal material constituted by multiple layers of metal or alloy. Among the materials, silver has the best shielding effect, and nickel-iron has better shielding effect against low-frequency signals. In practice, different kinds of metal particles may be mixed together in the shielding material as needed, to achieve a more comprehensive shielding effect. The resin material may be epoxy resin, organic silica gel, or the like, which may be selected based on as needed. A particle size of the metal particles may be between 0.1 µm and 30 µm. The metal particles may account for 1% to 95% of a weight of the shielding material. The size and proportion of the metal particles are selected flexibly based on requirements of shielding, which may be determined according to the EMI shielding effect corresponding to a proportion of metal composition.

In one embodiment, a thickness of the insulating protective layer may be between 1 nm and 5000 nm. Due to the insulating protective layer, the shielding material is insulating and may be applied directly on a chip module to achieve a shielding effect against interference, without coating the chip module with an insulating material in advance. The thickness may be determined based on a requirement of reliability and thermal conductivity. The insulating protective layer may be nano-scale, and may be made of materials such as resin, Teflon, silicon nitride or silicon oxide.

In one embodiment, silica particles may be added into the shielding material to reduce an expansion coefficient of the shielding material. Alumina particles may be added to increase a heat dissipation coefficient. A size of the silica particles may be between 0.1 µm and 30 µm. A size of the alumina particles may be between 0.1 µm and 30 µm. The silica particles and the alumina particles each may account for 1% to 40% of a weight of the shielding material. The silica particles or alumina particles are not limited to be spherical or circular, and may be of another shape such as flat or oval, or may be a mixture of particles of different sizes or shapes.

Figure 4:
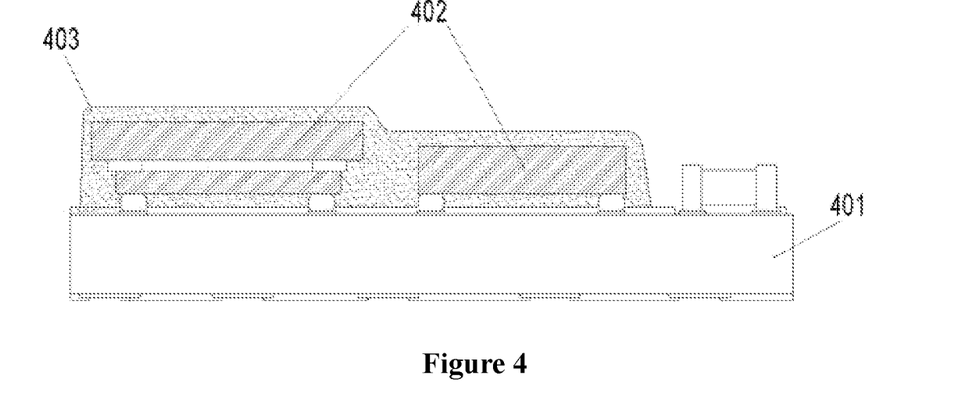
FIG. 4 is a schematic diagram of an EMI shielding structure according to an embodiment of the present disclosure.

FIG. 4 shows a schematic structural diagram of metal particles in a shielding material according to an embodiment of the present disclosure. In FIG. 4, a communication module product which is provided with the EMI shielding material as described in the present disclosure (that is, after encapsulation) is illustrated. As shown in FIG. 4, the communication module product includes module elements 402 provided on a substrate 401, where a periphery of each of the module elements 402 requiring EMI shielding is filled with the shielding material 403 as described above. In one embodiment, the segmented shielding is formed between the module elements 402. The shielding has no restriction in terms of regions or the module elements 402, which thus can be formed locally or between any elements such as capacitors, resistors and inductors. In particular, for the module element 402, both the top of the module element 402 and the bottom of the module element 402 (i.e., a regions between the module element 402 and the substrate 401) are filled with the shielding material, and a unique wraparound shielding on the module element 402 may be achieved. The EMI shielding region at the bottom of the module element greatly improves the shielding effect at the bottom of the module element 402 and solves a troublesome point for the industry. In addition, the shielding material disclosed in the present disclosure is non-conductive but containing metal particles, which thus does not affect an operation of the module element 402. In one embodiment, the thickness of the shielding material on the top of the module element 402 may be greater than 30 um, to obtain a better shielding effect in the region above the module element 402. Therefore, the shielding may be realized in six directions of the module element 402, and between multiple module elements 402.

The communication module product may be a radio frequency module product used in a wireless cellular terminal. The wireless cellular terminal may be a 2G/3G/4G/5G mobile phone, a Wi-Fi device, a Pad, a smart watch, an IOT device, a vehicle-mounted terminal, and the like. The module element 402 on the communication module product may be, for example, a filter, a switch, a low noise amplifier, an operational amplifier, a tuner, or a combination thereof.

Figure 5:
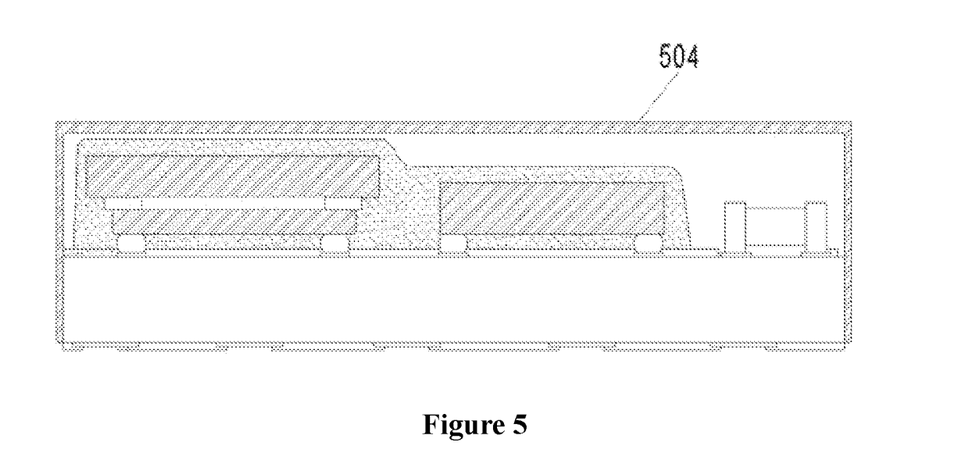
FIG. 5 is a schematic diagram of an EMI shielding structure according to another embodiment of the present disclosure.

FIG. 5 shows a schematic diagram of an EMI shielding structure according to an embodiment of the present disclosure. The embodiment shown in FIG. 5A differs from the embodiment shown in FIG. 4 in that: an outer metal shielding layer 504 is provided outside the communication module product, to realize double-layer shielding and achieving better shielding effect against low frequency interference.

Figure 6A:
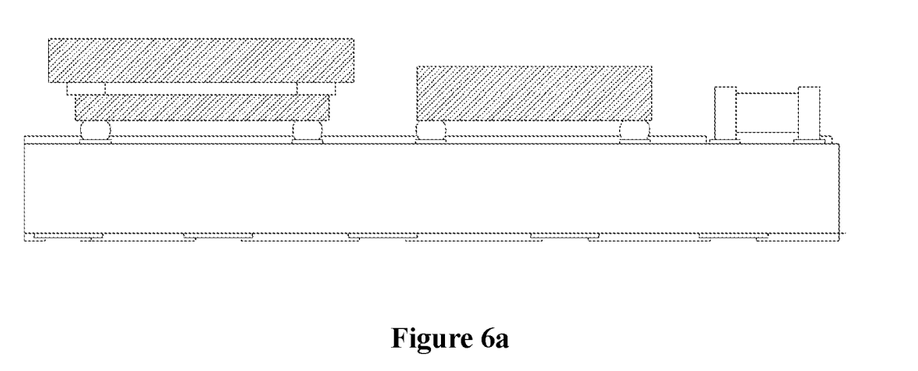
FIG. 6a to FIG. 6d show diagrams of an EMI shielding process according to an embodiment of the present disclosure.

FIG. 6a to FIG. 6d show diagrams of an EMI shielding process according to an embodiment of the present disclosure. First, as shown in FIG. 6a, module elements 402 are mounted on a substrate through SMT, and soldering and cleaning are performed. Each of the module elements 402 may include a chip such as a filter chip, a low noise amplifier (LNA), a switch, and an operational amplifier (PA), or may be any elements such as a resistor, a capacitor, an inductor, a combiner, or an LPF. The SMT is only an exemplary manner, and other processes may be adopted to mount the module elements.

Figure 6B:
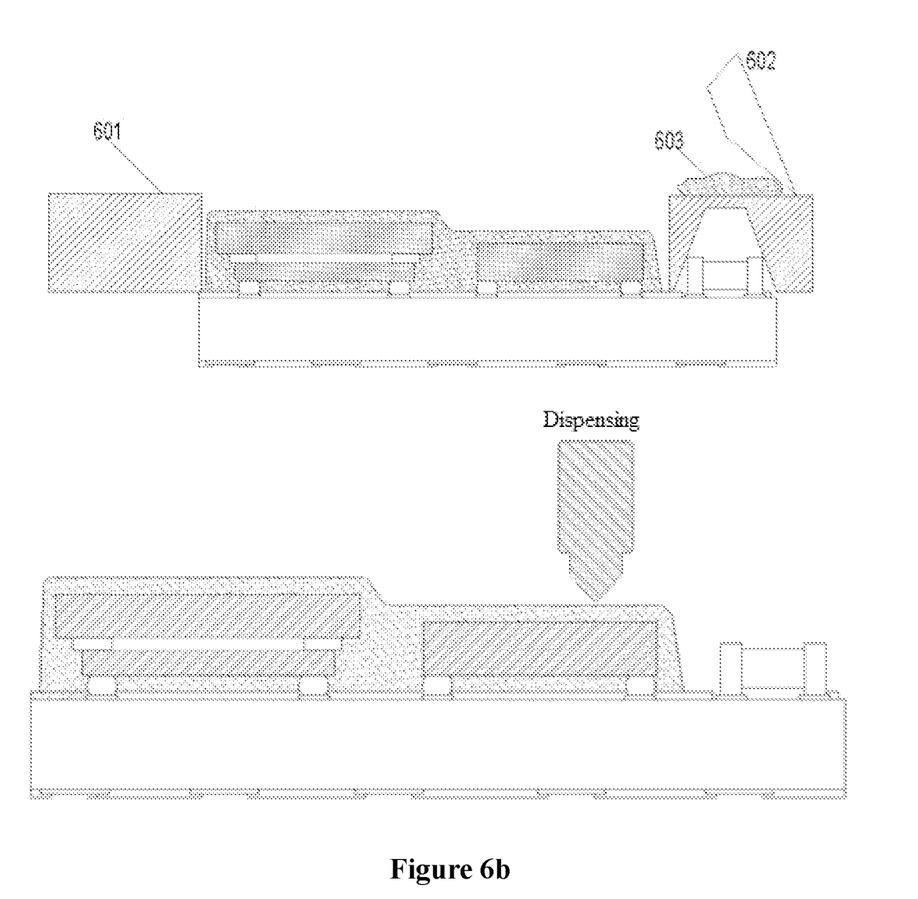

As shown in FIG. 6b, the shielding material provided in the present disclosure is applied to the substrate 401 through a printing process or a dispensing process, to cover and fill a chip region that requires to be shielded. The dispensing process includes filling or covering, with the shielding material, a bottom and a top of the module element through dispensing. Due to the properties of the shielding material, the EMI shielding material may be applied through a printing process. The printing process includes: arranging a customized screen 601 on a region to be covered, and then printing the shielding material to cover the region. The screen 601 may be made of metal or plastic. After printing, excess shielding material 603 may be removed by using a scraper 602. In one embodiment, the shielding material may be applied through vacuum printing. The shielding material can arrange to the bottom of the module elements 402 and the region between two module elements 402 better by the vacuum printing, to achieve sufficient filling. In addition, the bottom and the top of the module elements 402 may be covered by filling the bottom of the module elements 402 with glue, to reduce radio frequency signal interference between the module elements 402 (and also inside the module elements 402). Therefore, the application of the shielding material does not require additional slotting and frame fabrication, and therefore has low process difficulty and low cost.

Figure 6C:
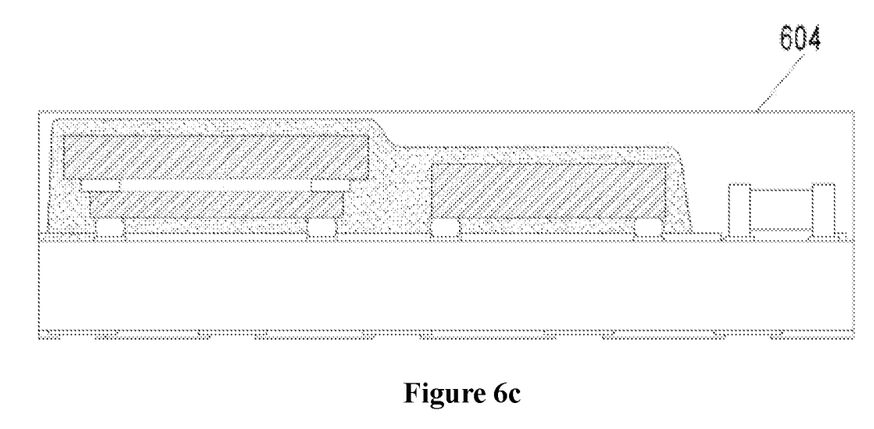
Figure 6D:
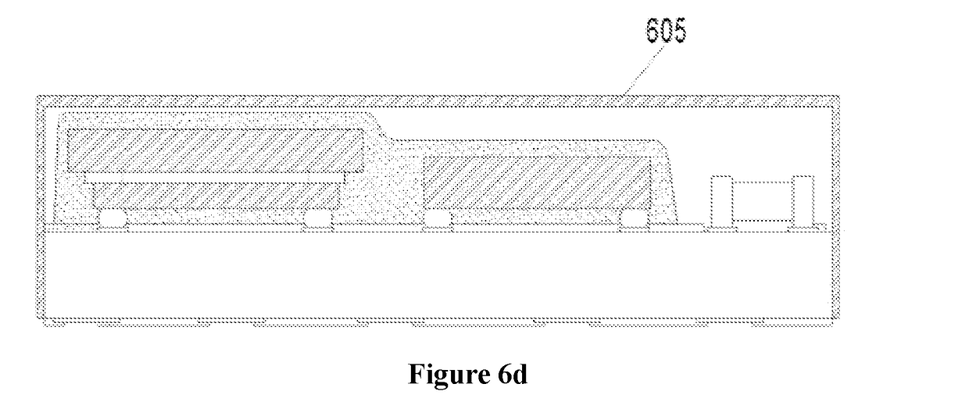

As shown in FIG. 6c, injection molding is performed on the communication module product after the shielding material is applied, to cover the product with an injection molding material 604. Then, in one embodiment, in a step shown in FIG. 6d, a metal shielding layer 605 is formed on an outermost layer of the product through sputtering or spraying. The product after encapsulation has effects of both segmented shielding and double-layer shielding. According to tests, such shielding process may achieve a shielding effect of 40 dB in a range of 500 MHz to 6 GHz.

The embodiments of the present disclosure have been described above, but the protection scope of the present disclosure is not limited thereto. Embodiments of the present disclosure shall be covered within the scope of the present disclosure. Therefore, the protection scope of the present disclosure should conform to the protection scope of the claims.

In the description of the present disclosure, it should be understood that an orientation or positional relationship indicated by terms such as "upper", "lower", "inner", "outer", and the like is defined based on the accompanying drawings, which is intended to facilitate description of the present disclosure and to simplify the description, rather than to indicate or imply that a device or element referred to must have a particular orientation or has to be constructed and operated in a particular orientation, and therefore should not be construed as limiting the present disclosure. The word 'comprise/include' does not exclude presence of elements or steps not listed in the claims. The word "a(n)" or "the" preceding an element does not exclude presence of multiple such elements. The mere fact that measures are recited in mutually different dependent claims does not indicate that a combination of these measures cannot be used to realize improvements. Any reference signs in the claims should not be construed as limiting the scope.

The invention claimed is:

1. A communication module product, comprising module elements provided on a substrate, wherein a periphery of the module elements where EMI shielding is to be performed is filled with EMI shielding material, to form a segmental shielding between the module elements, wherein the EMI shielding material comprises a resin material and metal particles, wherein the resin material and the metal particles are mixed with each other, and an insulating protective layer is disposed on a surface of each of the metal particles, and
   wherein a material of the metal particles is a gradient composite consisting of silver, gold, copper, chromium, nickel, and nickel-iron, an alloy thereof,
   wherein a size of the metal particles is between 0.1 μm and 30 μm, and
   wherein the shielding material further comprises a curing agent, wherein the curing agent account for 0.1% to 0.2% of a weight of the shielding material.

2. The communication module product according to claim 1, wherein the shielding material further comprises silica particles mixed in a specific proportion.

3. The communication module product according to claim 1, wherein the metal particles account for 1% to 95% of a weight of the shielding material.

4. The communication module product according to claim 1, wherein the resin material account for 1% to 30% of a weight of the shielding material.

5. The communication module product according to claim 1, wherein the metal particles comprise a mixture of particles made of different metal materials.

6. The communication module product according to claim 1, wherein the insulating protective layer on each of the metal particles is a coating of resin, Teflon, silicon nitride or silicon oxide, and a thickness of the insulating protective layer is between 1 nm and 5000 nm.

7. The communication module product according to claim 1, wherein a region between the module element and the substrate is filled with the EMI shielding material, and a top of the module element is filled with the EMI shielding material.

8. The communication module product according to claim 1, wherein the EMI shielding material at a top of the module element has a thickness greater than 30 μm.

9. The communication module product according to claim 1, wherein the communication module product is coated by a metal shielding layer.

10. The communication module product according to claim 1, wherein the shielding material further comprises alumina particles mixed in a specific proportion.

11. The communication module product according to claim 2, wherein the silica particles account for 1% to 40% of a weight of the shielding material.

12. The communication module product according to claim 2, wherein a size of the silica particles is between 0.1 μm and 30 μm.

13. The communication module product according to claim 10, wherein the alumina particles account for 1% to 40% of a weight of the shielding material.

14. The communication module product according to claim 10, wherein a size of the alumina particles is between 0.1 μm and 30 μm.

15. An EMI shielding process, comprising:
   step a, preparing a communication module on which module elements are provided; and
   step b, applying EMI shielding material on a region of the module elements on the communication module where EMI shielding is to be performed, through at least one of a printing process and a dispensing process, to form a segmental shielding between the module elements, wherein the EMI shielding material comprises a resin material and metal particles, the resin material and the metal particles are mixed with each other, an insulating protective layer is disposed on a surface of each of the metal particles, and
   wherein a material of the metal particles is a gradient composite consisting of silver, gold, copper, chromium, nickel, and nickel-iron, an alloy thereof,
   wherein a size of the metal particles is between 0.1 μm and 30 μm, and
   wherein the shielding material further comprises a curing agent, wherein the curing agent account for 0.1% to 0.2% of a weight of the shielding material.

16. The EMI shielding process according to claim 15, further comprising:
   step c, performing injection molding on the communication module after the shielding material is applied.

17. The EMI shielding process according to claim 16, further comprising:

step d, performing sputtering or spraying on an outer layer of the communication module after the injection molding, to form a metal shielding layer.

* * * * *